(12) United States Patent
Vaughan et al.

(10) Patent No.: US 7,768,787 B2
(45) Date of Patent: Aug. 3, 2010

(54) ELECTRONIC DEVICE WITH MODULAR BEZEL, AND METHOD OF CONFIGURATING ELECTRONIC DEVICE WITH MODULAR BEZEL

(75) Inventors: Brooks Vaughan, Houston, TX (US); Keith Kuehn, Spring, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 12/238,303

(22) Filed: Sep. 25, 2008

(65) Prior Publication Data

US 2009/0243445 A1    Oct. 1, 2009

Related U.S. Application Data

(60) Provisional application No. 61/041,015, filed on Mar. 31, 2008.

(51) Int. Cl.
*G06F 1/16* (2006.01)
(52) U.S. Cl. .................................. 361/725; 361/679.33
(58) Field of Classification Search .................. 361/724
See application file for complete search history.

(56) References Cited

U.S. PATENT DOCUMENTS

| | | | | |
|---|---|---|---|---|
| 5,199,776 A * | 4/1993 | Lin | ........................ | 312/293.3 |
| 5,542,757 A * | 8/1996 | Chang | ...................... | 312/223.2 |
| 6,590,848 B1 * | 7/2003 | Chen | .......................... | 720/654 |
| 6,826,038 B2 * | 11/2004 | Chen | ..................... | 361/679.33 |
| 6,940,731 B2 * | 9/2005 | Davis et al. | ................. | 361/801 |
| 7,338,140 B1 * | 3/2008 | Huang et al. | ............. | 312/223.2 |
| 2001/0046123 A1 * | 11/2001 | Wedding | .................... | 361/727 |
| 2002/0093806 A1 * | 7/2002 | Gough | ........................ | 361/816 |
| 2004/0032707 A1 * | 2/2004 | Chen | .......................... | 361/679 |
| 2009/0086421 A1 * | 4/2009 | Olesiewicz et al. | .... | 361/679.33 |

\* cited by examiner

*Primary Examiner*—Jayprakash N Gandhi
*Assistant Examiner*—Anthony Q Edwards

(57) ABSTRACT

A modular bezel for an electronic device can include a front panel and a connection device. The connection device can be configured to connect the modular bezel to a front portion of the electronic device and be configured to be disposed in a plurality of locations on the front portion of the electronic device, such as receptors of the electronic device that are not occupied by an electronic component or are not configured to receive or be occupied by an electronic component. Thus, the electronic device can be configured in a variety of different ways using the modular bezel.

19 Claims, 7 Drawing Sheets

ELECTRONIC DEVICE WITH MODULAR BEZEL, AND METHOD OF CONFIGURATING ELECTRONIC DEVICE WITH MODULAR BEZEL

CROSS REFERENCE TO RELATED APPLICATIONS

This application claims the benefit of provisional patent application Ser. No. 61/041,015, filed Mar. 31, 2008, titled "Electronic Device With Modular Bezel, And Method Of Configuring Electronic Device With Modular Bezel."

BACKGROUND OF THE INVENTION

1. Field of the Invention

The invention relates, in general, to a bezel for an electronic device and a method of configuring such an electronic device.

2. Description of Related Art

Multiple electronic devices, such as servers, often are disposed in a rack. FIG. 1 shows a conventional rack 10 with electronic devices disposed therein. FIG. 2 shows a specific example of one such electronic device 20. The electronic device 20 may include multiple electronic components, such as storage drives. The electronic device 20 often is a modular system, i.e., it permits different electronic components to be positioned within various receptors, bays, or slots in a housing of the electronic device 20 to create a desired configuration of those electronic components. A front portion of the housing of the electronic device 20 typically is open to allow a user to access the electronic components therein.

A single face plate or bezel 30, as shown separately in FIG. 3, often will be provided on the front portion of the electronic device 20 to, for example, improve its appearance. The bezel 30 is coupled to the front portion of the housing of the electronic device 20. The bezel 30 includes openings 32 to provide access to the various electronic components. The bezel 30 also covers or shields otherwise exposed portions of the open front of the housing of the electronic device 20.

Though not shown in FIGS. 2 and 3, the bezel 30 also may cover a receptor, bay, or slot in the housing of the electronic device 20 that is not occupied by an electronic component. Alternatively, a blank, which is not illustrated in the drawings, can be used to cover an opening 32 in a bezel 30 when an electronic component is not provided in that opening 32. Such a blank has only been used to cover openings 32 of a bezel 30 or other locations that contain hardware that makes them configured to receive or be occupied by an electronic component. Such a blank is configured to recognizable as being removable. For example, it can include features, such as a handle, that permit the blank to be grasped and easily removed.

Such prior art bezels 30 accommodate only a single configuration of electronic components. If the arrangement and/or number of electronic components for the electronic device 20 are changed, a new bezel must be designed and manufactured. For example, if the bezel 30 has been configured with two slots for electronic components, such as storage drives, a new bezel would have to be designed and manufactured if one wished to use a configuration with four slots. Similarly, a new bezel would have to be designed and manufactured to change the placement or arrangement of the electronic components amongst the slots.

Therefore, conventional bezels limit flexibility. Moreover, conventional bezels can increase manufacturing costs because a new bezel is required whenever it is desirable to change configurations.

SUMMARY

An embodiment of an electronic device includes a housing having a plurality of receptors, including a receptor configured to receive an electronic component and a receptor that is not configured to receive an electronic component, and at least one modular bezel disposed in the receptor that is not configured to receive the electronic component. The modular bezel includes a front panel and a connection device. The connection device is configured to connect the modular bezel to a front portion of the housing.

An embodiment of a method of configuring a front of an electronic device having a plurality of receptors, including a receptor configured to receive an electronic component and a receptor that is not configured to receive an electronic component, includes selecting a configuration of a front portion of the electronic device. It further includes providing at least one modular bezel in the receptor that is not configured to receive the electronic component to provide the selected configuration. The modular bezel comprises a front panel and a connection device. The connection device is configured to connect the modular bezel to a front portion of the electronic device.

BRIEF DESCRIPTION OF THE DRAWINGS

The accompanying drawings, which are incorporated in and constitute a part of this specification, illustrate embodiments of the invention and together with the description serve to explain principles of the invention.

DETAILED DESCRIPTION OF THE PREFERRED EMBODIMENTS

Figure 1:
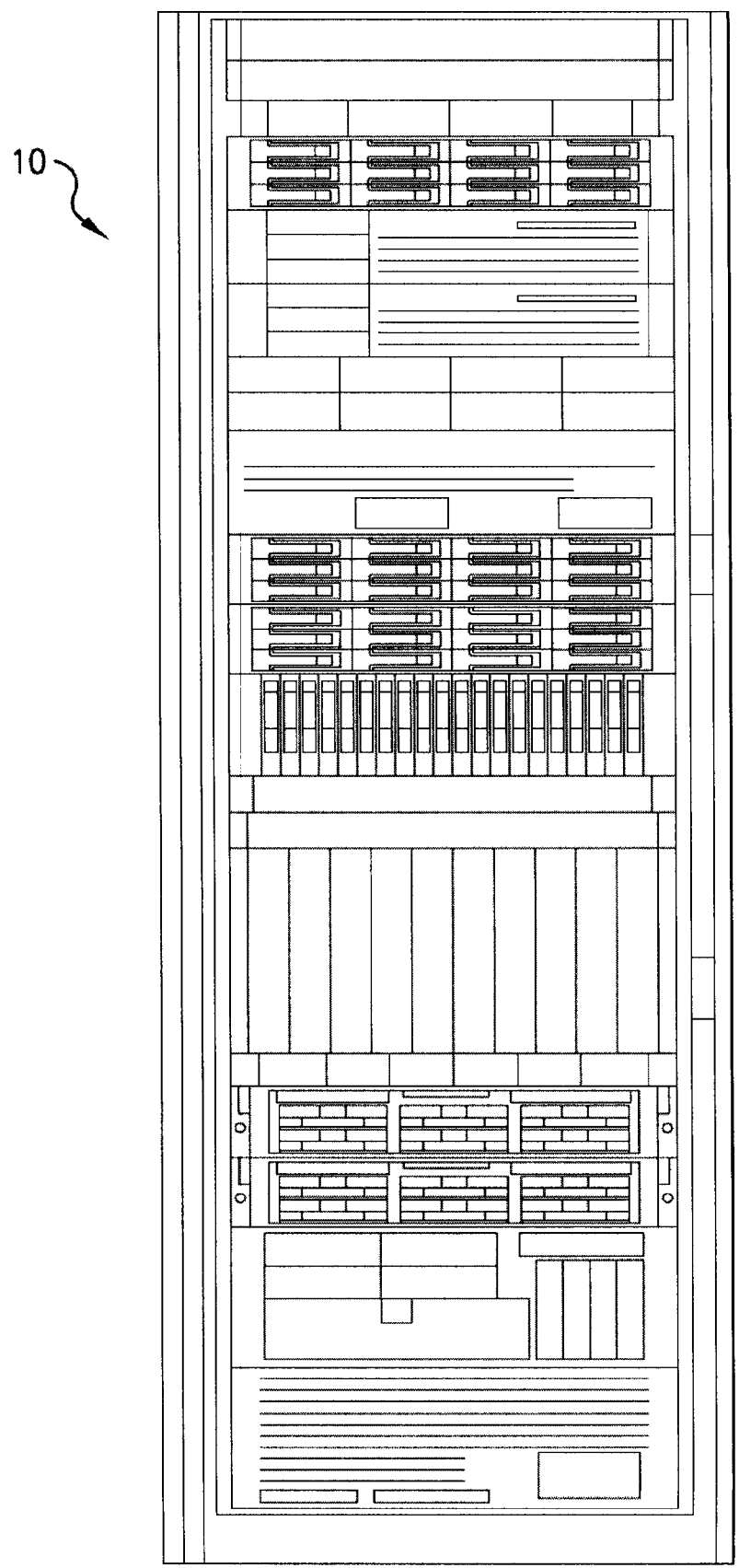
FIG. 1 is a front view of a prior art server rack.
Figure 2:
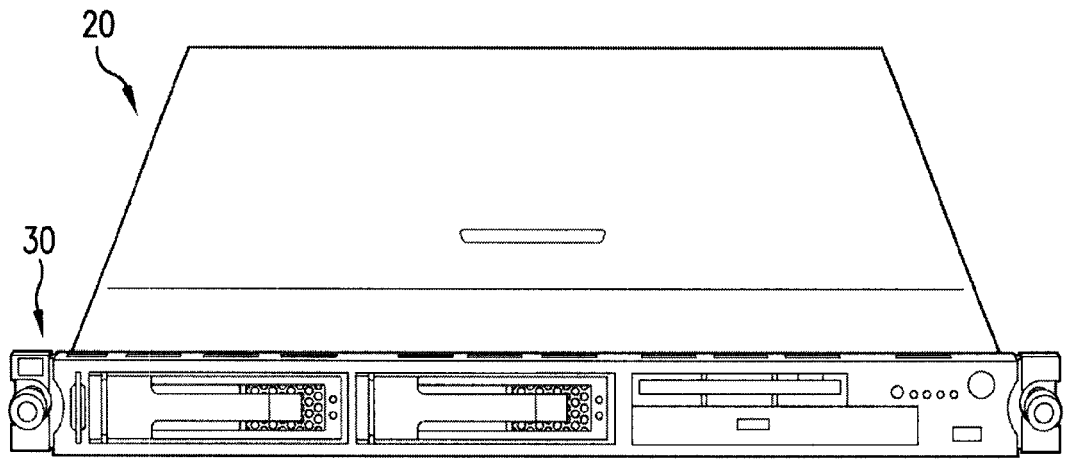
FIG. 2 is a perspective view of a prior art server including a bezel.
Figure 3:
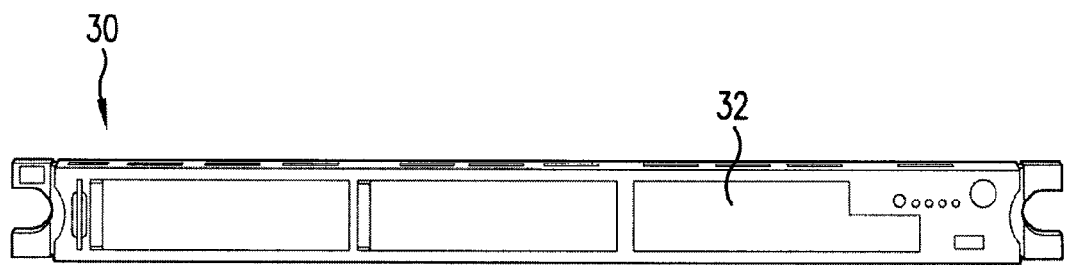
FIG. 3 is a front view of the prior art bezel of FIG. 2.

Presently preferred embodiments of the invention are illustrated in the drawings. In the drawings, an effort has been made to use like numerals to represent like parts.

Because electronic devices that are modular systems, such as servers, may require that electronic components therein be arranged differently or may require different numbers and/or types of electronic components, one or more modular bezels are provided that can flexibly accommodate many different configurations of electronic components, such as storage drives, within the electronic device. Each modular bezel can be configured to connect to one or more locations on a front portion of an electronic device. Use of the modular bezel can allow for a variety of configurations for the front portion of the electronic device. For example, a desired configuration of the front portion of the electronic device can be selected, and appropriate modular bezel(s) can be connected to locations on the front portion of the electronic device to provide that configuration. The modular bezel can be used, for example, to cover a receptor of an electronic device that is not configured to receive or house an electronic component. In other words, the modular bezel can be used to cover front portions of an electronic device that are not occupied by electronic components and do not contain the hardware necessary to do so. Furthermore, the modular bezel can be designed so that it is not easily removable.

Figure 4:
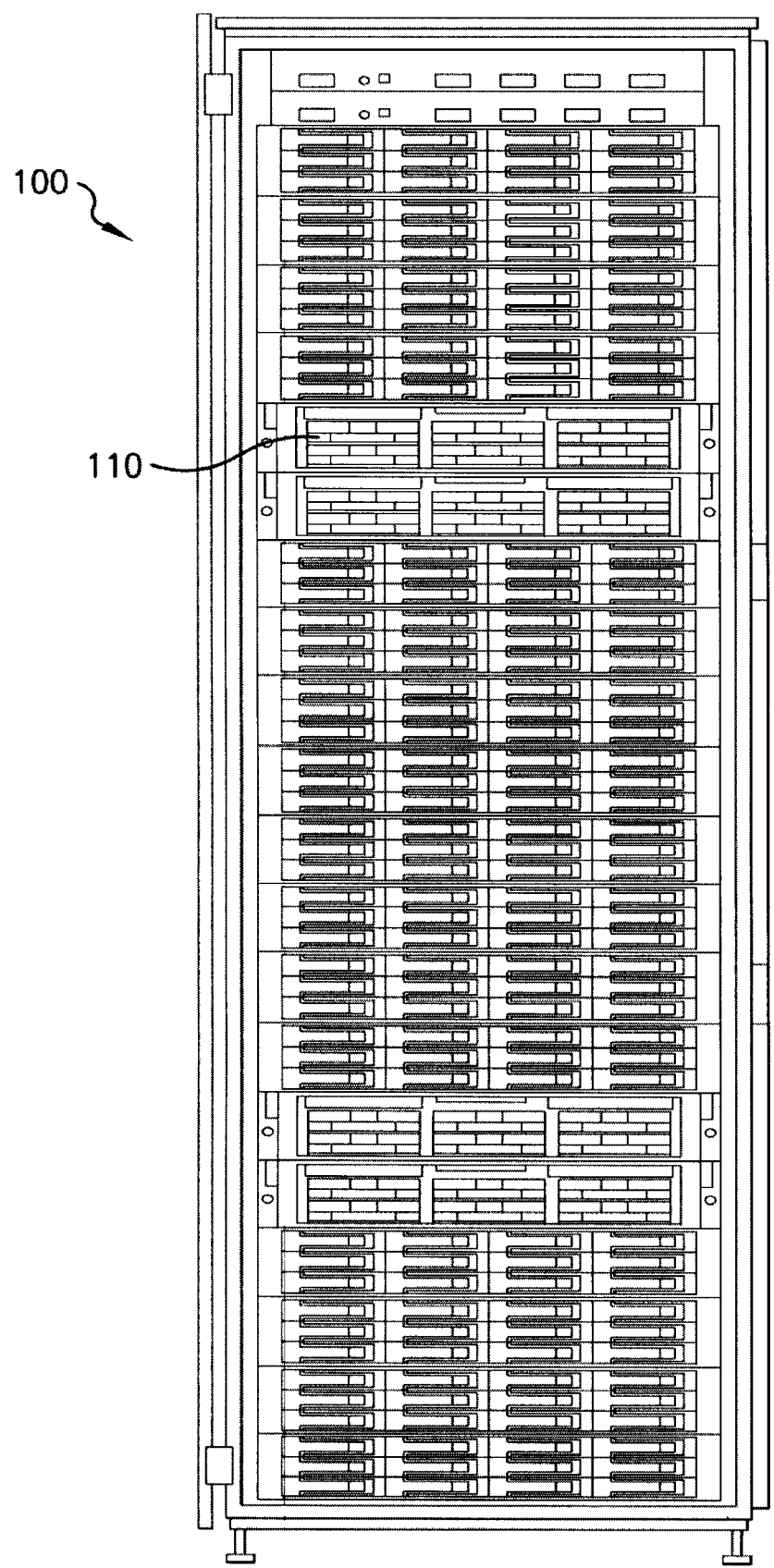
FIG. 4 is a front view of a rack with a plurality of electronic devices, such as, for example, servers with modular bezels, according to an embodiment.

Referring to FIGS. 4-11, an electronic device and a modular bezel are shown according to exemplary embodiments. FIG. 4 shows a front view of an embodiment of a rack 100 that includes a plurality of electronic devices 110.

Figure 5:
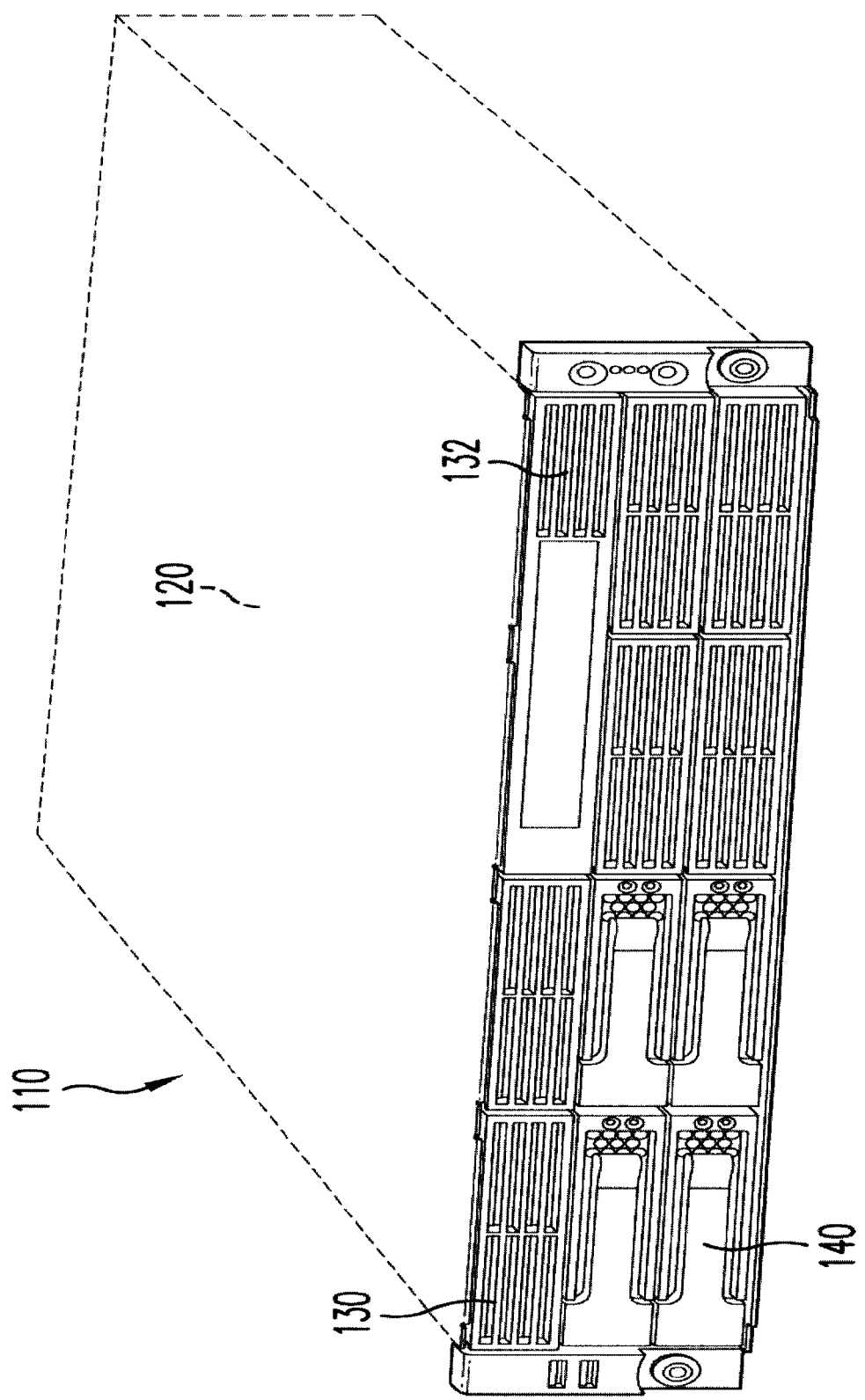
FIG. 5 is a perspective view of an electronic device, according to an embodiment.

FIG. 5 shows a perspective view of an embodiment of one such electronic device 110. The electronic device 110 can be, for example, a server. The electronic device 110 can include a chassis or housing 120 that holds electronic components 140, such as storage drives.

Figure 6:
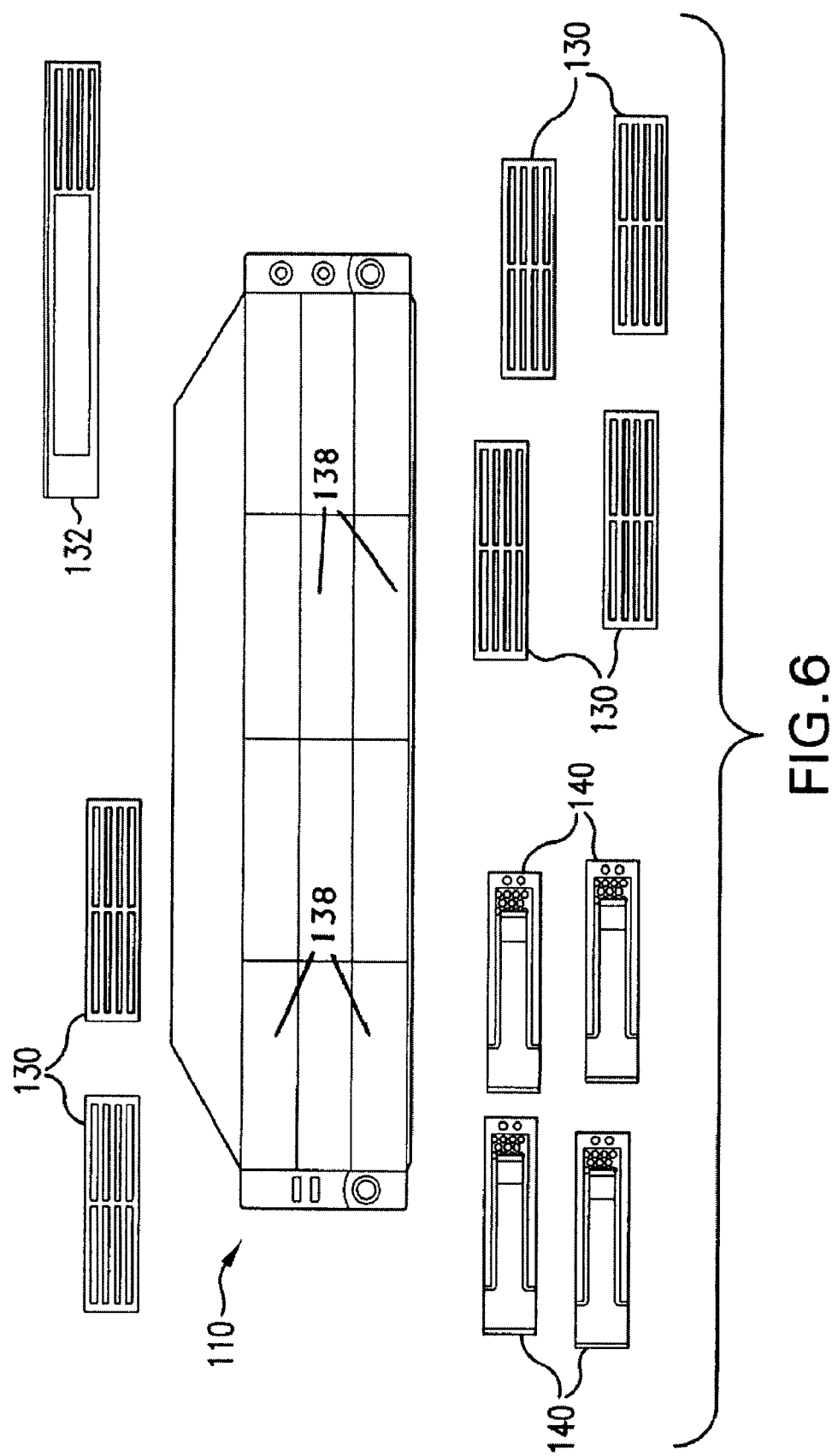
FIG. 6 is an exploded perspective view of the electronic device of FIG. 5 that includes various modular bezels.

FIG. 6 shows an exploded perspective view of the electronic device 110 of FIG. 5. As shown in that view, the housing 120 of the electronic device 110 can include receptors 138 (for example, bays, slots, receptacles, openings, cavities, compartments, etc.) for receiving the electronic components 140. A receptor 138 can be, for example, formed by two vertical walls and two horizontal walls of, for example, sheet metal.

Some of the receptors 138 may remain unoccupied by electronic components 140. Moreover, those receptors may not be configured to receive electronic components, e.g., they do not contain the hardware necessary to make an electronic component 140 operational. The number and/or arrangement of the electronic components 140 determines the amount and arrangement of free space on the front of the electronic device 110. This unoccupied free space can be occupied, covered, or shielded by one or more modular bezels 130, 132 to provide a front face of the electronic device 110 that is aesthetically pleasing.

The electronic components 140 and modular bezels 130, 132 can be arranged in various configurations on the front face of the electronic device 110 because of the modular nature of the bezels 130, 132, without the need to produce a new bezel for each configuration. The modular bezels 130, 132 can be configured such they may be rearranged or replaced, depending on the desired configuration of the individual electronic device 110.

Figure 7:
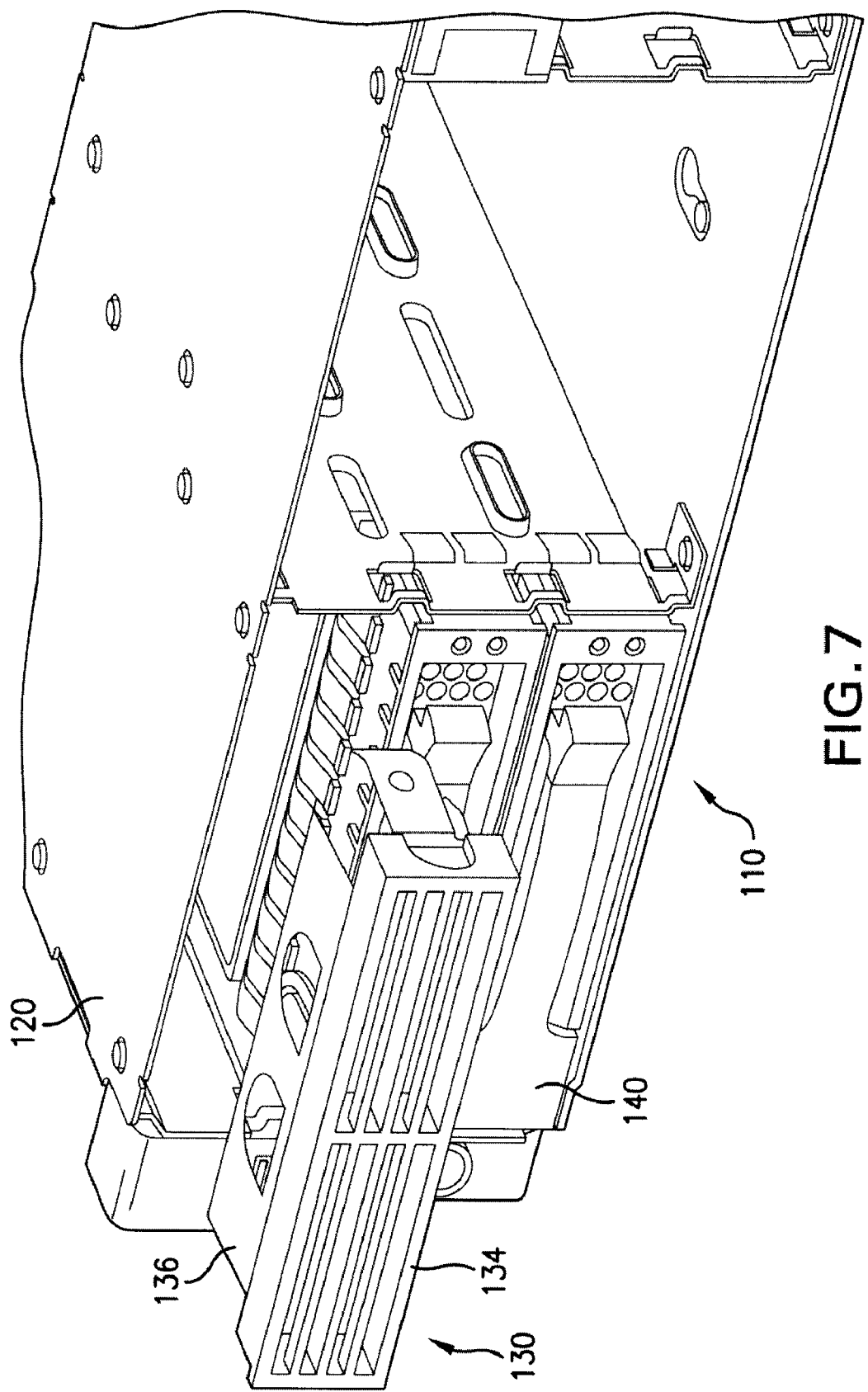
FIG. 7 is an isometric view of a portion of an electronic device and a modular bezel being inserted into the electronic device, according to an embodiment.
Figure 9:
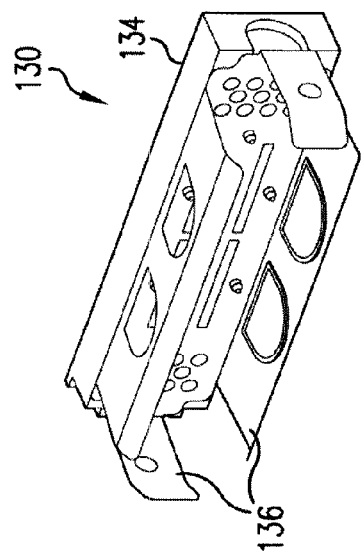
FIG. 9 is a rear isometric view of the modular bezel shown in FIG. 7.
Figure 11:
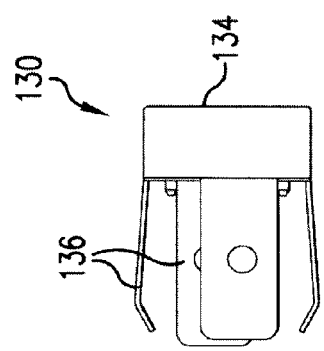
FIG. 11 is a side view of the modular bezel shown in FIG. 7.
Figure 8:
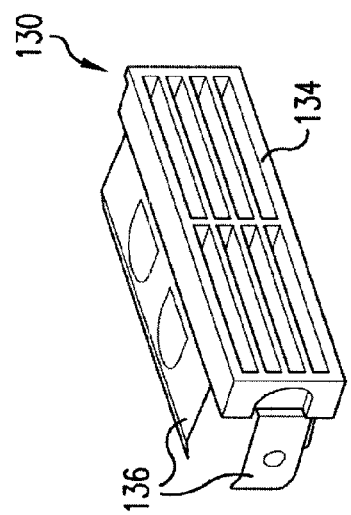
FIG. 8 is a front isometric view of the modular bezel shown in FIG. 7.
Figure 10:
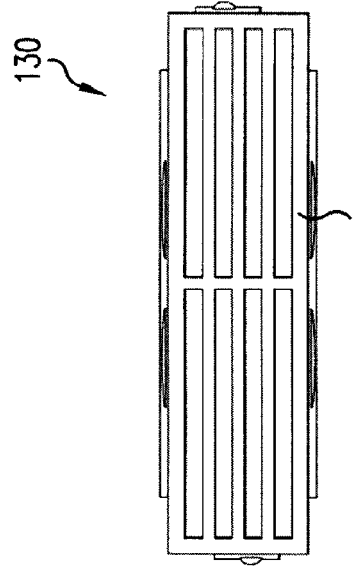
FIG. 10 is a front view of the modular bezel shown in FIG. 7.

FIG. 7 shows an embodiment of the modular bezel 130. It is configured such that it can be inserted into an individual receptor 138 of an electronic device 110, such as a receptor that is not occupied by an electronic component or a receptor that is not configured to receive or be occupied by an electronic component. As shown in FIGS. 8-11, the modular bezel 130 can include a front panel 134 and a connection device 136.

Preferably the front panel 134 is a substantially planar member that can cover a portion of the front of the electronic device 110. The front panel 134 can be, for example, a decorative panel. The front panel 134 can be made of a suitable material for a bezel, such as, for example, plastic. The front panel 134 can be designed so that the modular bezel 130 is not easily removed. For example, the front panel 134 can be designed to not include any portions designed to be grasped by a user to permit removal of the modular bezel 130 from a receptor 138 of an electronic device 110.

The connection device 136 can be configured to connect or couple the modular bezel 130 to the electronic device 110. For example, the connection device 136 can be configured to connect or couple the modular bezel 130, including the front panel 134, to the housing 120 of the electronic device 110 and, more particularly, in such a manner that the modular bezel 30 is received by at least one receptor 138 in the housing 120. In the illustrated embodiment, the connection device 136 can be a plurality of outwardly biased walls or arms. The wall or arms can be flexible, resilient members, such as pieces of sheet metal, that extend from the front panel 134. The walls or arms can be configured to connect or couple the modular bezel 130 to the housing 120 with a friction fit and/or due to elastic deformation of the connection device. For example, the walls or arms of the connection device 136 can connect or couple the modular bezel 130 to the electronic device 110 by engaging the horizontal and vertical walls of the receptor 138 in the housing 120 of the electronic device 110. The connection device 136 also can include a snap connection, a sheet metal frame, or any other suitable connection mechanism that connects or couples the modular bezel 130 to the electronic device 110.

According to these embodiments, the modular bezels 130, 132 are configured to be disposed in a plurality of locations on the front portion of the electronic device. In particular, preferably the modular bezels 130, 132 can be disposed in any of the receptors of the electronic device 110 that are not occupied by an electronic component 140. In another example, the modular bezels 130, 132 can be disposed in any receptor of an electronic device 110 that are not occupied by an electronic component 140 and are not configured to receive or be occupied by an electronic component 140.

The modular bezels 130, 132 can be formed with different sizes, shapes, and/or patterns that cover locations on the front portion of the electronic device 110. For example, a modular bezel 132 can be oversized, in the sense that it covers more than one receptor 138. It could, for example, cover two, three, four, or more receptors. Such a modular bezel 132 could use the same connection device 136 as described above in relation to with modular bezel 130. In any case, an area defined by an outer peripheral edge of a modular bezel 130, 132 preferably covers a portion of the front of the electronic device 110 that is less than an entire area of the front of the electronic device 110. Making the modular bezel 130, 132 smaller than the front of the electronic device 110 in this manner (and because the bezel can be disposed in a variety of locations), gives a user freedom to choose any of a variety of configurations for the electronic device 110.

For example, a configuration can be selected or conceived for the front of the electronic device 110. Electronic components 140 could be inserted in certain receptors 138 based on the selected configuration. Modular bezels 130, 132 could then be disposed in the remaining receptors 138 to provide the desired configuration. In other words, the configuration of the front of the electronic device 110 can be determined by the number and arrangement of electronic components 140 selected for the electronic device 110. The number and arrangement of electronic components 140 can determine the amount of free space, if any, that is unoccupied by the electronic components 140. One or more modular bezels 130, or oversized modular bezels 132, can then be selected to be coupled or connected to the electronic device 110 to occupy the free space left by the electronic devices 140, or space not figured to receive or be occupied by electronic devices 140, and complete the selected configuration of the front of the electronic device 110.

Should it become desirable to change the configuration of the front of the electronic device 110, the modular bezels 130, 132 permit and accommodate such change. For example, if it later becomes desirable to add new electronic components 140 to the electronic device 110, certain of the modular bezels 130, 132 can be removed to permit the addition of the electronic components 140. As another example, if it later becomes desirable to reposition existing electronic components 140 in the electronic device 110, the modular bezels 130, 132 can be repositioned to accommodate the new configuration. The modular bezels 130, 132 can be, for example, removed with the use of a tool or by hand in the absence of a tool.

The foregoing description of embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principals of the invention and its practical application to enable one skilled in the art to utilize the invention in various embodiments and with various modifications as are suited to the particular use contemplated. Other embodiments of the invention will be apparent to those skilled in the art from consideration of the specification and practice of the invention disclosed herein.

What is claimed is:

1. An electronic device, comprising:
   a rack-mountable housing having a plurality of receptors, including receptors configured to receive a number of electronic components, and a receptor that is not configured to receive one of the number of electronic components, and
   a quantity of modular bezels each configured such that it can be disposed in any of the plurality of receptors that are unoccupied by the number of electronic components, wherein each modular bezel includes:
      a front panel sized to cover two or more of the receptors and covering a portion of the front of the rack-mountable housing, the front panel excluding any features that are graspable as an aid in removing the modular bezel from a receptor, and
      a connection device configured to be receivable by any one of the plurality of receptors to connect the modular bezel to the rack-mountable housing,
   wherein each of the plurality of receptors is occupied by either one of the number of electronic components or one of the quantity of modular bezels, and the quantity of modular bezels can be arranged in different configurations to accommodate different configurations of the number of electronic components in the plurality of receptors.

2. The electronic device of claim 1, wherein the electronic device includes receptors that are not configured to receive one of the number of electronic components, with one of the quantity of modular bezels being disposed in each of the receptors that are not configured to receive the one of the number of electronic components.

3. The electronic device of claim 2, wherein each of the quantity of modular bezels is configured to be disposed in each of the receptors that are not configured to receive the one of the number of electronic components.

4. The electronic device of claim 1, wherein an area defined by an outer peripheral edge of each modular bezel is configured to cover a portion of the front of the rack-mountable housing that is less than an entire area of the front of the rack-mountable housing.

5. The electronic device of claim 1, wherein the front panel is a substantially planar member.

6. The electronic device of claim 1, wherein the front panel is a plastic member.

7. The electronic device of claim 1, wherein the front panel is a decorative panel.

8. The electronic device of claim 1, wherein the rack-mountable housing includes at least one unoccupied receptor configured to receive one of the number of electronic components, wherein the connection device of one of the quantity of modular bezels is connected to the unoccupied receptor.

9. The electronic device of claim 1, wherein the connection device is configured to connect the front panel to the rack-mountable housing by at least one of friction between the connection device and the rack-mountable housing, elastic deformation of the connection device, and a snap connection.

10. The electronic device of claim 1, wherein the connection device comprises a plurality of flexible members configured to engage the rack-mountable housing.

11. The electronic device of claim 1, wherein the electronic device is a server.

12. A method of configuring a front of an electronic device having a rack-mountable housing with a plurality of receptors, including a portion of the receptors configured to receive an electronic component and a portion of the receptors not configured to receive an electronic component, comprising:
   installing a number of electronic components in the portion of the receptors configured to receive the electronic component according to a first particular configuration;
   providing modular bezels in the portion of the receptors that are not configured to receive the number of electronic components;
   providing modular bezels in unoccupied receptors that are configured to receive the number of electronic components; and
   re-arranging the number of electronic components and modular bezels in a second particular configuration, different from the first particular configuration,
   wherein each modular bezel comprises:
      a front panel sized to cover two or more of the plurality of receptors, and
      a connection device, wherein the connection device is configured to connect the modular bezel to a front portion of the rack-mountable housing.

13. The method of claim 12, wherein the electronic device includes a plurality of receptors that are not configured to receive an electronic component, the method further comprising:
   providing a plurality of modular bezels in the receptors that are not configured to receive an electronic component.

14. An apparatus, comprising:
   a rack;
   a rack-mountable housing coupled to the rack and having a plurality of receptors, including receptors configured to receive a number of electronic components, and a receptor that is not configured to receive one of the number of electronic components, and
   a quantity of modular bezels each configured such that it can be disposed in any of the plurality of receptors that are unoccupied by the number of electronic components, wherein each modular bezel includes:

a front panel covering a portion of the front of the rack-mountable housing, the front panel excluding any features that are graspable as an aid in removing the modular bezel from a receptor, and a connection device configured to be receivable by any one of the plurality of receptors to connect the modular bezel to the rack-mountable housing, wherein each of the plurality of receptors is occupied by either one of the number of electronic components or one of the quantity of modular bezels, and the quantity of modular bezels can be arranged in different configurations to accommodate different configurations of electronic components in the plurality of receptors.

15. The apparatus of claim 14, wherein the rack-mountable housing includes receptors that are not configured to receive an electronic component and the quantity of modular bezels are disposed in the receptors that are not configured to receive the electronic component.

16. The apparatus device of claim 15, wherein each of the plurality of modular bezels is configured to be disposed in each of the receptors that are not configured to receive the electronic component.

17. The apparatus of claim 14, wherein an area defined by an outer peripheral edge of the modular bezel is configured to cover a portion of the front of the rack-mountable housing that is less than an entire area of the front of the rack-mountable housing.

18. The apparatus of claim 14, wherein the rack-mountable housing includes a plurality of receptors that are not configured to receive one of the number of electronic components, with one of the quantity of modular bezels being disposed in each of the receptors that are not configured to receive the one of the number of electronic components.

19. The apparatus of claim 14, wherein the connection device is configured to connect the front panel to the rack-mountable housing by at least one of friction between the connection device and the rack-mountable housing, elastic deformation of the connection device, and a snap connection.

* * * * *

UNITED STATES PATENT AND TRADEMARK OFFICE
CERTIFICATE OF CORRECTION

PATENT NO.      : 7,768,787 B2
APPLICATION NO. : 12/238303
DATED           : August 3, 2010
INVENTOR(S)     : Brooks Vaughan et al.

It is certified that error appears in the above-identified patent and that said Letters Patent is hereby corrected as shown below:

In column 7, line 19, in Claim 16, after "apparatus" delete "device".

Signed and Sealed this
First Day of March, 2011

David J. Kappos
*Director of the United States Patent and Trademark Office*